United States Patent
Pfister

(10) Patent No.: US 6,749,498 B2
(45) Date of Patent: Jun. 15, 2004

(54) VENTILATED OUTDOOR ELECTRONICS ENCLOSURE

(75) Inventor: Steven Pfister, Dunwoody, GA (US)

(73) Assignee: Arris International, Inc., Sowanee, GA (US)

( * ) Notice: Subject to any disclaimer, the term of this patent is extended or adjusted under 35 U.S.C. 154(b) by 0 days.

(21) Appl. No.: 10/230,896

(22) Filed: Aug. 29, 2002

(65) Prior Publication Data

US 2003/0050002 A1 Mar. 13, 2003

Related U.S. Application Data

(60) Provisional application No. 60/323,007, filed on Sep. 12, 2001.

(51) Int. Cl.[7] ............................................. H05K 5/03
(52) U.S. Cl. ................................. 454/184; 361/692
(58) Field of Search .......................... 454/184, 237, 454/250; 361/690, 692, 693

(56) References Cited

U.S. PATENT DOCUMENTS

| | | | |
|---|---|---|---|
| 5,022,314 A | * | 6/1991 | Waggoner ................ 454/250 |
| 5,267,122 A | | 11/1993 | Glover |
| 5,762,550 A | * | 6/1998 | Brunner ................... 454/184 |
| 5,812,373 A | | 9/1998 | Hwang |
| 5,912,803 A | | 6/1999 | Dahl |
| 5,960,592 A | | 10/1999 | Lilienthal |
| 6,067,223 A | * | 5/2000 | Diebel et al. ............. 361/676 |
| 6,110,468 A | * | 8/2000 | Collins et al. ........... 424/204.1 |
| 6,400,567 B1 | | 6/2002 | McKeen |
| 6,401,463 B1 | | 6/2002 | Dukhan |
| 6,579,168 B1 | * | 6/2003 | Webster et al. ............ 454/184 |

* cited by examiner

*Primary Examiner*—Gregory A. Wilson
(74) *Attorney, Agent, or Firm*—John L. Doughty

(57) ABSTRACT

An enclosure for providing abundant convection cooling to components placed therein while protecting the components from environmental factors external to the enclosure. Wall, roof and floor structures form a compartment for containing the components; the wall structures define openings for air passage into the compartment through a bottom opening and out of the compartment through a top opening, as internally warmed air is moved by convection through the enclosure.

Louvers in the walls prevent precipitation and other external environmental elements from entering the compartment through the bottom openings. An overhang eave of the roof has a lip that extends downwardly to prevent precipitation intrusion through the top opening or openings. Screen material internally affixed to the walls covers the openings to prevent entry of insects and small animals to the inside of the compartment.

20 Claims, 4 Drawing Sheets

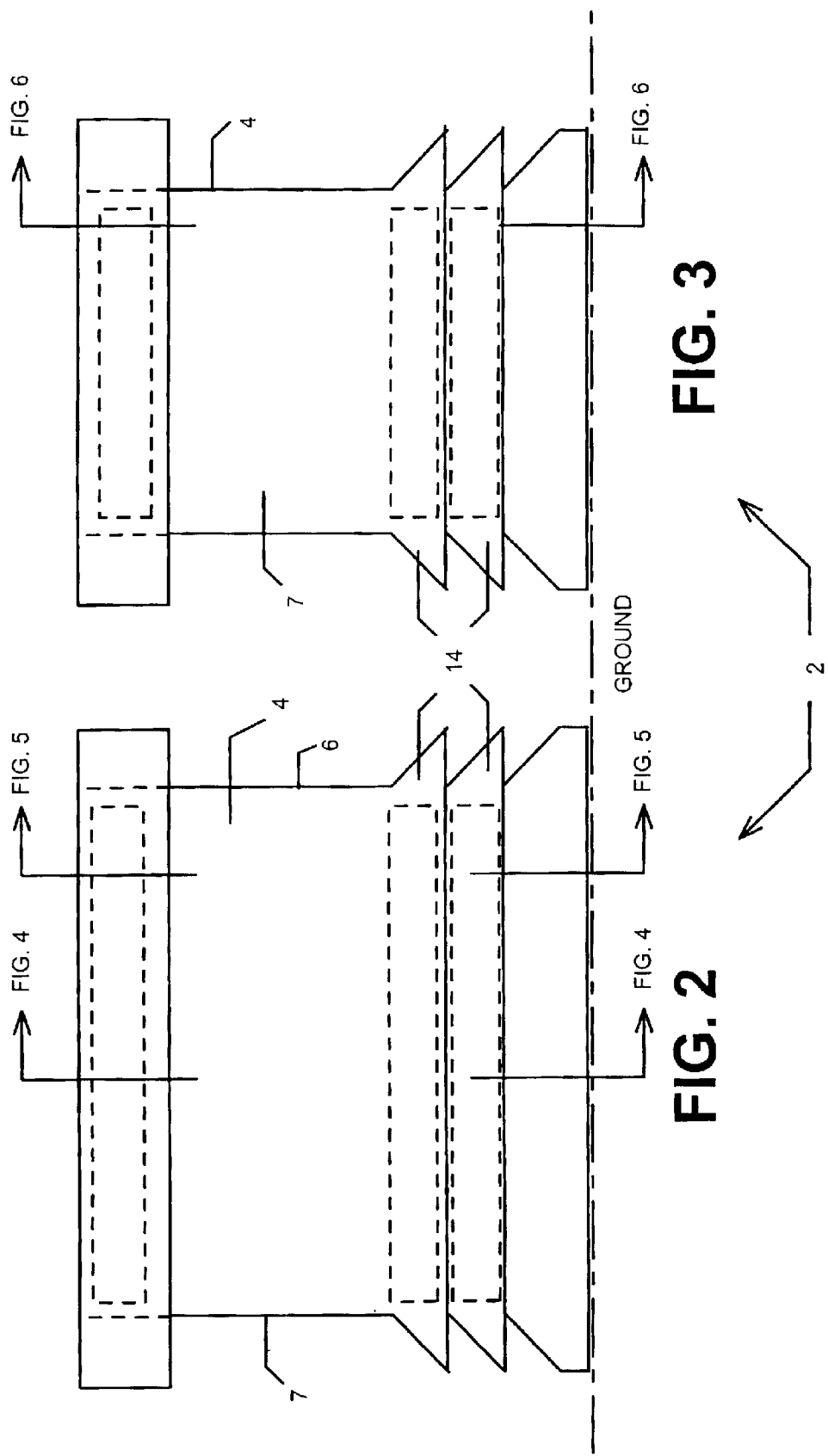

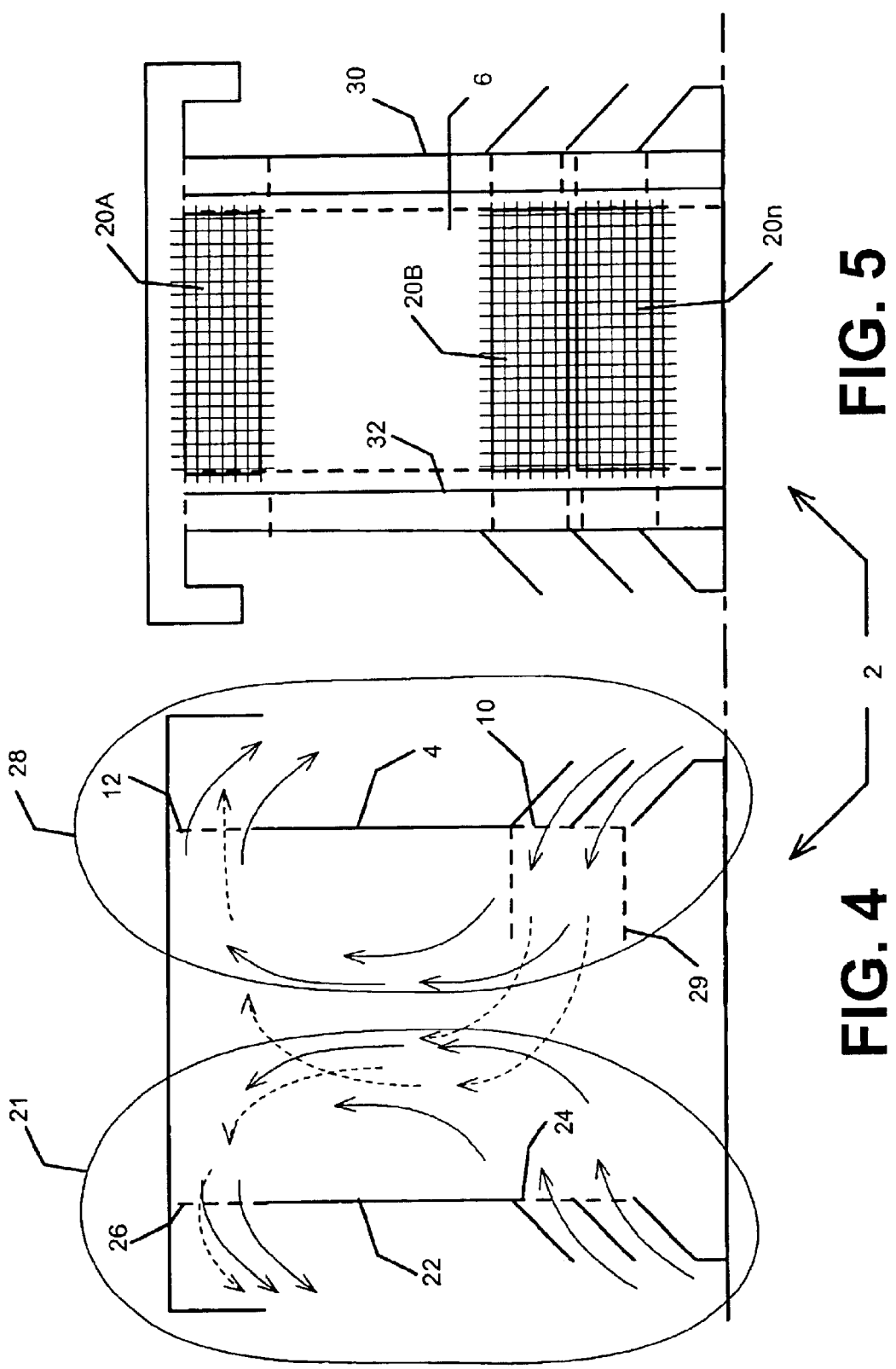

VENTILATED OUTDOOR ELECTRONICS ENCLOSURE

CROSS REFERENCE TO RELATED APPLICATION

This application claims priority under 35 U.S.C. 119(e) to the benefit of the filing date of Pfister, U.S. provisional patent application No. 60/323,007 entitled "Ventilated Outdoor Electronics Enclosure", which was filed Sep. 12, 2001, and is incorporated herein by reference.

FIELD OF THE INVENTION

This invention relates, generally, to communication networks and, more particularly, to housings that protect components contained therein from inhospitable environmental surroundings.

BACKGROUND

As broadband networks continue to move from the experimental realm to the order of the day for network and service providers, the competition-driven need for providers to reduce costs of implementation increases proportionally. Plain Old Telephone Service ("POTS") has traditionally relied on copper twisted-pair cabling to deliver telephony signals. Similarly, community Access Television ("CATV") has traditionally relied on metallic coaxial ("coax") cabling to deliver video signals. Currently, as the frontier of optical fiber networks delivering broadband signals expands past more and more residential homes, technologies are continually emerging that allow providers to continually increase the number of subscribers reached by their networks. These technologies include, for example, active fast and gigabit Ethernet components.

Providers delivering signals over POTS and CATV networks have been able to use electronic amplifiers placed along a twisted pair or coax cable to boost a signal carried thereon depending on the distance the signal must travel. Optical network providers have used passive optical networks ("PONS"), which use splitters in a distribution network to take a signal from a single waveguide and split out a plurality of signals for sending to a corresponding plurality of different subscribers. Unlike the active components of the electronic amplifiers used in a POTS or CATV network system, the PONS splitters use primarily passive components, such as mirrors. However, in order to increase subscriber density served by a single fiber, optical network providers are increasingly using active components in the field. These active components may include electronic amplifies similar to PONS and CATV systems, but may also require optical signal interface components, such as, for example, lasers.

Although the heat generated by the active electrical and electronic components of the active optical devices may be of magnitude similar to that of the active components of a POTS or CATV system, the optical lasers produce substantially more heat than these components. Thus, since it is desirable to house the electrical, optical and laser components in a single housing, more heat is typically produced in a single enclosure. Since heat is an enemy of active components, the housing that encloses the components should be designed to allow removal of heat away from the active components at a high enough rate to eliminate destructive temperature levels at the discrete components of a particular node or subscriber premise equipment, for example.

However, while the heat transfer rate should be high, the enclosure should protect its internal components from the potential harshness of the outdoors. The internal components should be protected from weather, such as extreme cold and heat, as well as precipitation. In addition, insects and small animals should be prevented from entering the enclosure. All the while costs should be restrained.

Various enclosure designs have been made in attempting to provide the foregoing features. For example, U.S. Pat. No. 6,401,463 to Dukham et al. discusses an enclosure using a vortex tube, a compressed air source and a forced draft fan. U.S. Pat. No. 6,400,567 to McKeen et al. discusses an enclosure having at least two separate airflow paths with a baffle separating them. U.S. Pat. No. 5,960,592 to Lilienthal, II et al. discusses an enclosure comprising double walls which can be filled with concrete. U.S. Pat. No. 5,812,373 to Hwang discusses an enclosure using a heat conducting material to remove heat from an inner container. U.S. Pat. No. 5,912,803 to Dahl et al. discusses an enclosure having at least two separate airflow paths with a baffle separating them. And, U.S. Pat. No. 5,267,122 to Glover et al. discusses an enclosure that uses metallic fins that sealingly penetrate the enclosure to essentially wick heat from inside the enclosure to the outside.

While the foregoing references purport to protect components from the environment and remove heat at the same time, they are complex; thus, costly. Therefore, there is a need in the art for an inexpensive enclosure for protecting internal components from the environment while providing ample cooling to the active components contained therein.

SUMMARY

An objective of the invention is to use an environmentally hardened housing to isolate internal components, such as, for example, an optical switch having active components, from an outdoor or underground environment.

It is another objective to provide ample cooling for the active components contained within the enclosure. These components may include active electrical and electronic devices, as well as lasers, which typically produce large amounts of heat. An aspect facilitates the required cooling while the aforementioned environmental protection is retained.

It is yet another objective to provide such an enclosure that is simple to manufacture and install in the field, thus minimizing costs.

Generally described, an aspect comprises a formed enclosure, the enclosure comprising front and back opposing walls, left and right opposing walls and a roof. The walls and roof, which may be rectangular, for example, may be connected together in a typical box fashion such that the roof is substantially parallel to the ground and the walls are perpendicular thereto. The enclosure may also include a floor opposing the roof and parallel thereto.

Each of the connected walls may define at least one bottom opening disposed in the wall proximate the floor. Each bottom opening may be rectangularly shaped with each short side of the opening being parallel and proximate a corner edge defined by the intersection of the wall and one of its adjoining walls, and each long side of the opening being parallel the floor.

Each wall may also define at least one top opening disposed in the wall proximate the roof. Each top opening or openings may be rectangularly shaped with each short side of the opening being parallel and proximate a corner edge defined by the intersection the wall and one of its adjoining walls, and each long side of the top opening being parallel to the floor and roof.

Precipitation may be deflected from each bottom opening by a louver sloping downwardly from a wall end to a distal end. Each top opening may be shrouded by a continuous overhanging eave that runs around the perimeter of the roof. Each opening may be covered by screen material designed to maximize airflow while preventing entry of insects and small animals through the openings into the enclosure. The enclosure may also comprise a strand mounting bracket for mounting the enclosure from an overhead strand.

BRIEF DESCRIPTION OF DRAWINGS

FIG. 2 illustrates an external elevation side view of the enclosure.

FIG. 3 illustrates an external elevation front (or rear) view of the enclosure.

FIG. 4 illustrates an external elevation side section view of the enclosure, further schematically illustrating typical airflow patterns through the enclosure.

FIG. 5 illustrates an internal elevation side section view of the enclosure.

DETAILED DESCRIPTION

As a preliminary matter, it readily will be understood by those persons skilled in the art that the present invention is susceptible of broad utility and application. Many methods, embodiments and adaptations of the present invention other than those herein described, as well as many variations, modifications, and equivalent arrangements, will be apparent from or reasonably suggested by the present invention and the following description thereof, without departing from the substance or scope of the present invention.

Accordingly, while the present invention has been described herein in detail in relation to preferred embodiments, it is to be understood that this disclosure is only illustrative and exemplary of the present invention and is made merely for the purposes of providing a full and enabling disclosure of the invention. The following disclosure is not intended nor is to be construed to limit the present invention or otherwise to exclude any such other embodiments, adaptations, variations, modifications and equivalent arrangements, the present invention being limited only by the claims appended hereto and the equivalents thereof. Furthermore, while some aspects of the present invention are described in detail herein, no specific screen material, container-construction-material, container shape, louver shape, eave dimension, number or shape of apertures, for example, is required to be used in the practicing of the present invention.

Figure 1:
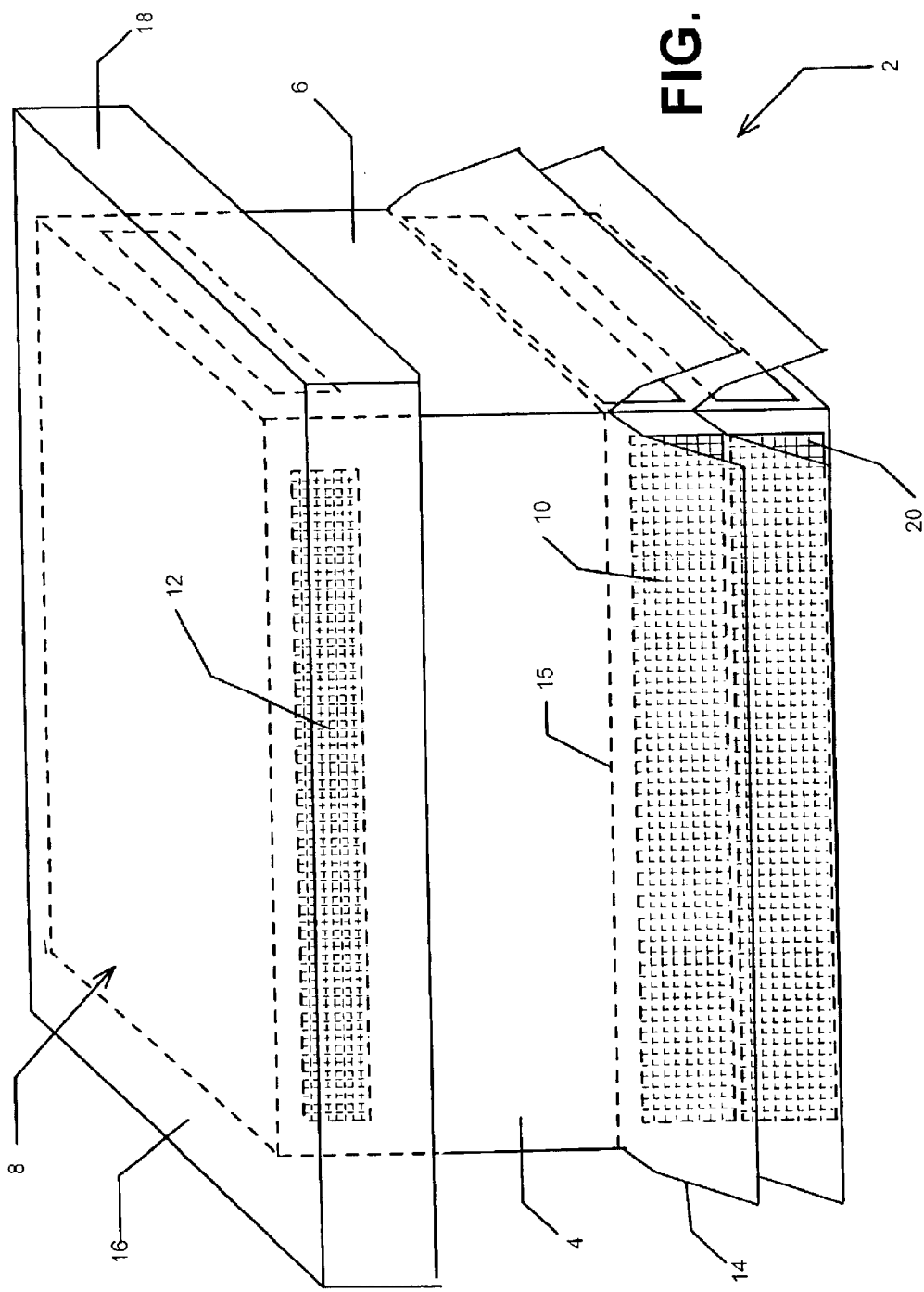
FIG. 1 illustrates a perspective view of a ventilated outdoor electronics enclosure providing improved convection current cooling.

Turning now to the figures, FIG. 1 illustrates a ventilated outdoor electronics enclosure 2. In the preferred embodiment, the box shaped enclosure 2 includes a front wall 4 and a corresponding opposing back wall (not shown in FIG. 1), as well as a right side wall 6 and a corresponding opposing left side wall (also not shown in FIG. 1). These walls are joined together to form a container that is covered by roof 8. To facilitate airflow through enclosure 2 by convection current, at least one bottom aperture 10 permits entry of air into the enclosure near the bottom of the enclosure, and at least one top aperture 12 allows air that has been heated by internal components dissipating heat within the enclosure 2 to escape. Since air enters at ambient temperature near the bottom of the enclosure and exits near the top after it has been heated, a natural convection current is established, thereby naturally moving airflow through the enclosure 2. Thus, the need for fans or other means of artificially forcing air through the enclosure does not exist.

To protect components housed inside the enclosure 2 from the environment external to the enclosure, louver 14 shields bottom aperture 10. Although only one louver 14 is referred to by reference number in the drawing for clarity, it will be appreciated that multiple louvers may be used if multiple bottom apertures are implemented. Louver 14 slopes downward away from the wall at edge 15, where it intersects its corresponding wall, to divert precipitation, dust and other environmental factors away from its corresponding bottom aperture 10. The downwardly sloping nature of louver 14 also provides the benefit that air pulled into the enclosure 2 will be cool, as cold air tends to seek the lowest possible elevation. Since relatively higher air will be less likely to be pulled into the enclosure than air underneath the louver, louver 14 facilitates the coolest ambient air being drawn into enclosure 2.

To prevent environmental elements from entering the enclosure 2 through the at least one top aperture 12, the roof 8 may be configured with an overhanging eave 16 that extends beyond the edges where the roof 8 intersects the walls, such that the eave surrounds the perimeter of the container formed by the walls. In addition to the eave 16, which extends the edge of the roof 8 away from the at least one top opening 12, the roof may also comprise an eave lip 18 that extends downwardly to an elevation below the lowest edge of the at least one top aperture 12. The eave lip 18 diverts precipitation and other harmful environmental elements away from the top aperture 12. The eave lip 18 drops away from the roof perpendicularly to the surface thereof, or may slope downwardly in the same manner as the louver 14 as described above.

In addition to louver 14, eave 16 and lip 18, screen material 20 may cover bottom aperture 10 and top aperture 12 to prevent insects and small animals from entering enclosure 2 and disturbing the components contained therein. It will be appreciated that with respect to the illustration of FIG. 1, for purposes of clarity, the bottom aperture 10, top aperture 12, and screens 20 that cover these openings defined by front wall 4 have been discussed and illustrated. However, the opposing rear wall, and the two opposing sidewalls of the preferred embodiment will also typically define apertures and louvers of similar shape and number as the front and rear. In the rectangular preferred embodiment illustrated and described, the apertures and louvers defined by the rear wall will also typically be of similar size as the apertures shown and discussed with respect to front wall 4. The sidewalls, typically having a smaller width dimension that the front and rear walls, will typically have the same number of apertures as the front and rear, and will typically be proportionally sized with respect to the width dimension of the side wall as are the apertures of the front and rear walls with respect to their corresponding width dimension.

It will also be appreciated that although the rectangular preferred embodiment is shown, the footprint of enclosure 2 may be any geometric shape as required by a particular installation. Thus, instead of a rectangular footprint, all four walls of enclosure 2 may be of equal dimension, for example, therefore providing a square footprint. Or, the footprint may be cylindrical or octagonal, for example. Regardless of the footprint shape, the enclosure will have at least one aperture near the bottom of the enclosure and at least one other aperture near the top of the enclosure, all apertures being of adequate size to provide ample convection cooling of internal components.

Turning now to FIG. 2, an outer elevation view of front wall 4 is shown. Top and bottom apertures are shown by dashed lines for reference. Cut lines provide references for views shown in FIGS. 4 and 5. Referring now to FIG. 3, an outer elevation view of left side wall 7 is shown. Top and bottom apertures are shown by dashed lines for reference. Cut lines provide references for the view shown in FIG. 6. In reference to both FIGS. 2 and 3 together, it will be appreciated that louvers 14 will preferably be continuous around enclosure 2 such that there are no breaks in the louvers at the corner intersections of any two walls. Such breaks are shown in FIG. 1 for the purpose of illustrating screens 20 that cover the apertures, and further that the screens are typically mounted on the inside of the wall defining the particular aperture. However, while a continuous louver is preferred, the apertures and louvers may be designed for a particular installation such that they are not continuous.

Turning now to FIG. 4, an inside section elevation view is shown illustrating the enclosure 2 cut through front wall 4 and the opposing rear wall 22 as indicated by the corresponding cut lines of FIG. 4. Apertures and screens are not shown in order to schematically illustrate typical convection current flow patterns through enclosure 2. For instance, air flow represented by rear airflow current lines 21 enter the enclosure through rear wall 22 through at least one bottom aperture 24. The air is heated by internal electronic and/or laser components and thus tends to rise inside the enclosure 2. Since the rear top aperture 26 is near the top of the enclosure 2, the air current 21 rises practically the entire height of the enclosure before exiting through the rear top aperture 26. Thus, once this 'chimney effect' is created, the inertia of the moving air mass naturally draws more air through bottom aperture 24 to replace the volume of air that is exiting through top aperture 26, thereby naturally forcing air flow through the enclosure. A similar process occurs for airflow 28 that enters bottom aperture 10, rises through the enclosure 2 and exits through top aperture 12. Similarly, though not shown, airflow also enters sidewall bottom apertures, rises through enclosure 2 and exits through sidewall top apertures. Although the illustration of FIG. 4 indicates that airflow 21 occurs in the rear half of enclosure 2 and airflow 28 occurs in the front half, it will be appreciated that mixing of the airflows may occur. Location, size and shape of the apertures may be specifically designed to guide airflow to a particular region of the enclosure where a concentration of heat occurs, such as the location of a laser or amplifier, for example. In addition, various flow nozzles may optionally be included at the apertures to further guide airflow to a particular location. The optional nozzle 29 is shown incorporated with bottom aperture 10, however any of the apertures may benefit from such nozzles, which may be varied in shape, size and location. Thus, airflow patterns may be customized to accommodate various internal component configurations within the enclosure 2.

Turning now to FIG. 5, an inside section elevation view is shown illustrating the enclosure 2 cut through front wall 4 and the opposing rear wall 22 as indicated by the corresponding cut lines of FIG. 3. Screens 20 are shown covering the apertures defined by right sidewall 6. Furthermore, it is shown that the screens 20 are mounted to the inside of wall 6, as the screen material is shown overlapping the outer boundaries of the apertures. The alphabetic reference letters are used to indicate that each aperture of enclosure 2 may be covered by screen material 20. However, based on the design requirements of a particular installation, screen material may not be desirable. In addition, the material used may be selected based on particular installation needs. For example, metallic screen mesh may be used. Alternatively, if proximity to nearby electrical circuits housed inside enclosure 2 raise electrical concerns, mesh made of fiberglass, or similar material may be desirable. In addition, fiberglass may also be preferred as a screen mesh material in highly corrosive environments, such as may exist near sea water.

With respect to the size of the apertures, it is desirable to have large enough openings to permit ample airflow through the enclosure 2. However, there must be some breaks in the apertures to support the portions of a particular wall that is above a particular aperture. Thus, columns 30 and 32 exist where wall material has not been removed to create apertures. Furthermore, these columns may be used for mounting of circuit boards, for example, that are mounted such that part of an aperture is higher than the circuit board and part is below the circuit board, thereby providing cooling for a top and a bottom side of the circuit board. Moreover, it will be appreciated that the top aperture or apertures, and the bottom aperture or apertures will be located in their corresponding walls to maximize the convection current through the enclosure 2. Thus, a top aperture will typically be located as close to the top of its corresponding wall as possible. Likewise, a bottom aperture will typically be located as close to the bottom of its corresponding wall as possible. The aim is to create a vertically oriented ventilation path to facilitate natural convection, while blocking as much solar load as possible (i.e. a chimney with a sun shield). Of course, design criteria specific to a particular installation may control how high or low top or bottom apertures are located respectively in a wall. For instance, if an enclosure 2 is to be located in an area where standing water is likely, a bottom aperture may be located higher in its corresponding wall than if the design location environment were relatively dry.

Figure 6:
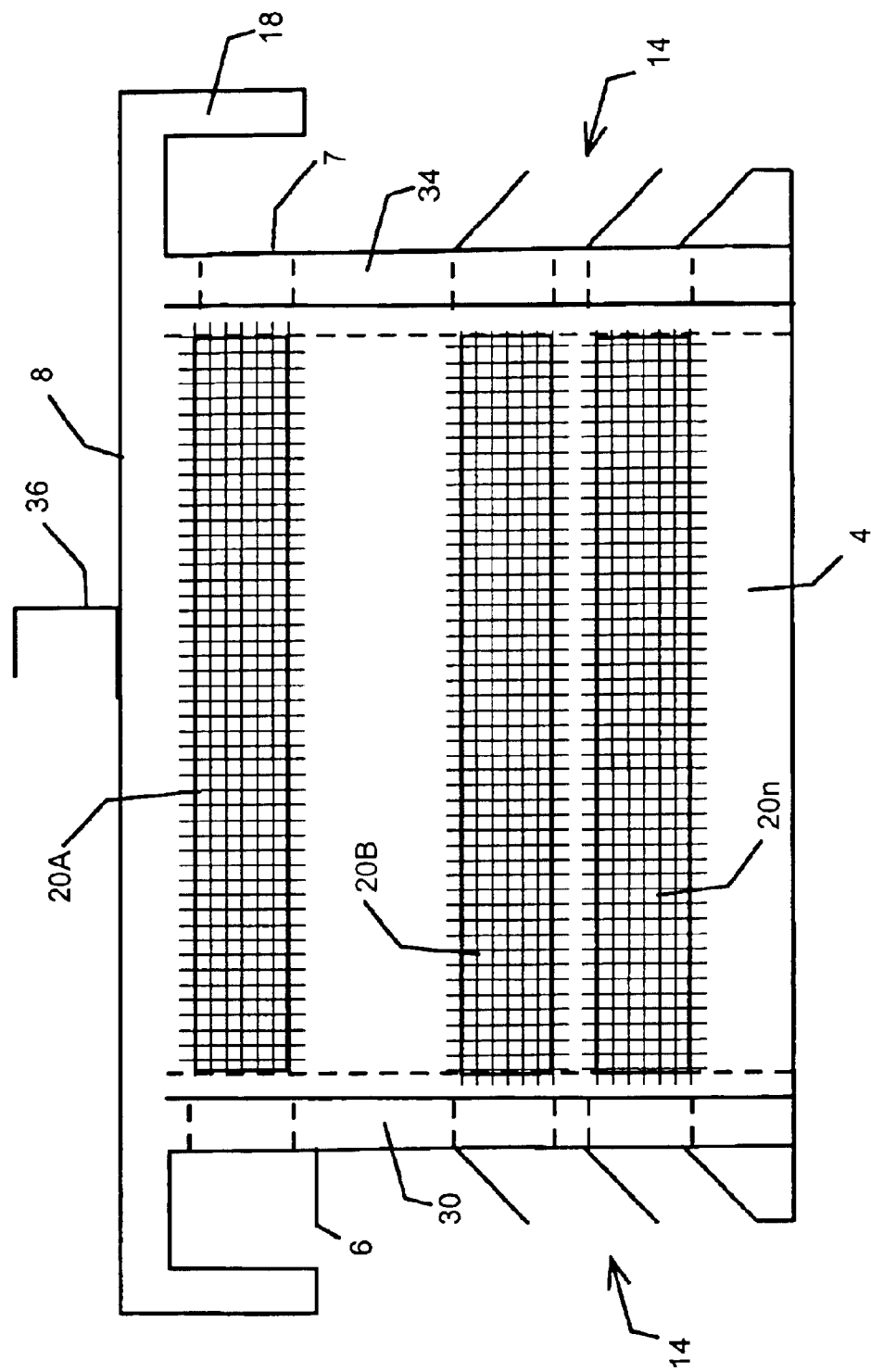
FIG. 6 illustrates an internal elevation side front (or rear) cross section view of the enclosure.

Turning now to FIG. 6, an inside section elevation view is shown illustrating the enclosure 2 cut through front wall 4 and the opposing rear wall 22 as indicated by the corresponding cut lines of FIG. 3. Screen 20A covers the top aperture, and screens 20B and 20n cover the bottom apertures. The designation of screen 20n is used to signify that, although the drawing shows only two bottom apertures, there could be more apertures depending on the size of enclosure 2 and the amount of heat generated by the components housed therein. Thus, while the drawing shows one top and two bottom apertures defined by front wall 4, the alphabetic characters are used to show that, although the same type of screen material may typically be used to cover all apertures, enclosure 2 comprises more than one aperture, either top or bottom.

With respect to the apertures themselves, none will typically extend the entire width of the particular wall that defines it. Thus, columns 30 and 34 provide support for the wall above a given aperture. Otherwise, if the apertures extended the entire width of a given wall, there would be no rigid support for the wall portions and roof above the aperture.

Although the columns may be separate components from the walls, they need not be. In a non-metallic version of the enclosure, for example, it may be cost effective to design the columns integral to the enclosure. Thus, if, for example, the entire enclosure 2 is manufactured using a molding process such that the entire enclosure is essentially a single piece (except a bottom and/or the top that may be removable to allow installation and maintenance access for the components contained in the enclosure), the columns would merely be wall material that remains after casting molds are removed leaving apertures in their place. Metallic versions may offer slightly higher heat dissipation, but are typically more costly.

Column 30 is shown in the drawing as comprising material of front wall 4 and side wall 6, such that the column is essentially defined by the extent to which the apertures extend towards the corner intersection of wall 4 and wall 6. Column 34 is similarly defined by at the corner intersection of wall 4 and wall 7. The section view of walls 6 and 7 represent the apertures defined in those walls with the dashed lines there through. As FIG. 6 illustrates a view of the inside of wall 4, it will be appreciated that lip 18 preferably runs around the perimeter of roof 8, such that the top aperture defined in wall 4 covered by screen 20A will be protected from precipitation intrusion, as will the top apertures defined in walls 6 and 7. Similarly, louvers 14 preferably run continuously around the perimeter of the enclosure such that the bottom apertures covered by screens 20B and 20n are shielded from precipitation intrusion, as are the bottom apertures defined in walls 6 and 7 as indicated by the dashed lines. Node strand mounting bracket 36 is shown attached to top 8 to facilitate mounting to a cable strand. Mounting of sealed node housings to strands is known in the art.

What is claimed is:

1. A ventilated outdoor electronics enclosure for providing convection cooling to internal components comprising:
   front and back opposing walls defining at least one bottom aperture and at least one top aperture;
   opposing side walls intersecting the front and back walls to form a compartment, the side walls defining at least one bottom aperture and at least one top aperture;
   a floor intersecting the walls to form a bottom of the compartment; and
   a roof forming a top of the compartment, the roof defining an overhanging eave that extends past the walls to a distal edge.

2. The enclosure of claim 1 wherein the eave further comprises a lip extending downwardly from the distal edge of the eave.

3. The enclosure of claim 1 wherein each bottom aperture is disposed in its corresponding wall proximate the floor and each top aperture is disposed in its corresponding wall proximate the roof to maximize convection current through the enclosure.

4. The enclosure of claim 1 wherein each aperture is rectangularly shaped with each short side of the aperture being parallel and proximate a corner edge defined by the intersection of the aperture's corresponding wall and one of its adjoining walls, and each long side of the aperture being parallel the floor.

5. The enclosure of claim 1 wherein each top aperture is rectangularly shaped with each short side of the aperture being parallel and proximate a corner edge defined by the intersection of the aperture's corresponding wall and one of its adjoining walls, and each long side of the top aperture being parallel to the roof.

6. The enclosure of claim 1 wherein each wall further comprises at least one louver intersecting said wall along a wall edge, the louver sloping downwardly from the wall edge to a distal edge for repelling external environmental elements from the at least one bottom aperture, the louver dimension and slope angle selected such that the distal end is at least as low as a bottom edge of the corresponding bottom aperture and the wall edge is approximately as high as a top edge of the corresponding bottom aperture.

7. The enclosure of claim 2 wherein the distal edge lip of the eave extends to an elevation lower than a bottom edge of each top aperture.

8. The enclosure of claim 1 wherein each aperture is internally covered by screen material.

9. The enclosure of claim 1 further comprising a strand mounting bracket for mounting the enclosure from an overhead strand.

10. The enclosure of claim 1 wherein each wall defines at least one top aperture and at least one bottom aperture.

11. A method for providing convection cooling for components located in an outdoor environment comprising the steps of:
   enclosing the components inside a ventilated outdoor enclosure; and
   placing the ventilated outdoor enclosure outdoors where the components are needed, the ventilated outdoor enclosure comprising:
   front and back opposing walls defining at least one bottom aperture and at least one top aperture;
   opposing side walls intersecting the front and back walls to form a compartment, the side walls defining at least one bottom aperture and at least one top aperture;
   a floor intersecting the walls to form a bottom of the compartment; and
   a roof forming a top of the compartment, the roof defining an overhanging cave that extends past the walls to a distal edge.

12. The method of claim 11 wherein the eave further comprises a up extending downwardly from the distal edge of the eave.

13. The method of claim 11 wherein each bottom aperture is disposed in its corresponding wall proximate the floor and each top aperture is disposed in its corresponding wall proximate the roof to maximize convection current through the enclosure.

14. The method of claim 11 wherein each aperture is rectangularly shaped with each short side of the aperture being parallel and proximate a corner edge defined by the intersection of the aperture's corresponding wall and one of its adjoining walls, and each long side of the aperture being parallel the floor.

15. The method of claim 11 wherein each top aperture is rectangularly shaped with each short side of the aperture being parallel and proximate a corner edge defined by the intersection of the aperture's corresponding wall and one of its adjoining walls, and each long side of the top aperture being parallel to the roof.

16. The method of claim 11 wherein each wall further comprises at least one louver intersecting said wall along a wall edge, the louver sloping downwardly from the wall edge to a distal edge for repelling external environmental elements from the at least one bottom aperture, the louver dimension and slope angle selected such that the distal end is at least as low as a bottom edge of the corresponding bottom aperture and the wall edge is approximately as high as a top edge of the corresponding bottom aperture.

17. The method of claim 12 wherein the distal edge lip of the eave extends to an elevation lower than a bottom edge of each top aperture.

18. The method of claim 11 wherein each aperture is internally covered by screen material.

19. The method of claim 11 further comprising a strand mounting bracket for mounting the enclosure from an overhead strand.

20. The method of claim 11 wherein each wall defines at least one top aperture and at least one bottom aperture.

* * * * *